(12) United States Patent
Kanazawa et al.

(10) Patent No.: US 8,154,118 B2
(45) Date of Patent: Apr. 10, 2012

(54) SEMICONDUCTOR DEVICE

(75) Inventors: Masaki Kanazawa, Niiza (JP); Hideki Asuke, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/055,550

(22) PCT Filed: Jun. 19, 2009

(86) PCT No.: PCT/JP2009/061180
§ 371 (c)(1),
(2), (4) Date: Jan. 24, 2011

(87) PCT Pub. No.: WO2010/010769
PCT Pub. Date: Jan. 28, 2010

(65) Prior Publication Data
US 2011/0133561 A1 Jun. 9, 2011

(30) Foreign Application Priority Data

Jul. 25, 2008 (JP) ................................. 2008-191963

(51) Int. Cl.
*H01L 23/00* (2006.01)
(52) U.S. Cl. ................................ 257/724; 257/E21.499
(58) Field of Classification Search .................. 257/690, 257/531, 686, 777, 676, 724, E21.499
See application file for complete search history.

(56) References Cited

U.S. PATENT DOCUMENTS

| | | | | |
|---|---|---|---|---|
| 5,834,825 A * | 11/1998 | Imai | ............................... | 257/531 |
| 5,884,990 A * | 3/1999 | Burghartz et al. | ............ | 336/200 |
| 6,054,329 A * | 4/2000 | Burghartz et al. | ................. | 438/3 |
| 6,104,084 A | 8/2000 | Ishio et al. | | |
| 6,611,035 B2 * | 8/2003 | Inoue | ............................. | 257/421 |
| 6,800,533 B1 * | 10/2004 | Tan et al. | ...................... | 438/381 |
| 7,183,630 B1 * | 2/2007 | Fogelson et al. | ............. | 257/666 |
| 7,193,320 B2 * | 3/2007 | Hosoyamada et al. | ........ | 257/738 |
| 7,884,444 B2 * | 2/2011 | Strzalkowski | ................ | 257/531 |
| 2002/0048668 A1 * | 4/2002 | Inoue | ............................. | 428/210 |
| 2003/0013264 A1 * | 1/2003 | Yeo et al. | ....................... | 438/381 |
| 2004/0032011 A1 * | 2/2004 | Warner et al. | ................. | 257/676 |
| 2009/0072388 A1 * | 3/2009 | Tews et al. | .................... | 257/724 |

FOREIGN PATENT DOCUMENTS

| | | |
|---|---|---|
| JP | 11 3970 | 1/1999 |
| JP | 2001 327171 | 11/2001 |
| JP | 2005 136272 | 5/2005 |
| JP | 2006 280100 | 10/2006 |
| WO | 2007 029384 | 3/2007 |

OTHER PUBLICATIONS

International Search Report issued Sep. 1, 2009 in PCT/JP09/061180 filed Jun. 19, 2009.

* cited by examiner

*Primary Examiner* — Nathan Ha
(74) *Attorney, Agent, or Firm* — Oblon, Spivak, McClelland, Maier & Neustadt, L.L.P.

(57) ABSTRACT

A semiconductor device (10) includes: an base substance (15) having a ferromagnetic material; a first semiconductor chip (11) and a second semiconductor chip (12) installed on the base substance (15); a first coil (131) installed on the base substance (15) and electrically connected to the first semiconductor chip (11); a second coil (132) installed on the first coil (131), electromagnetically connected to the first coil (131) and electrically connected to the second semiconductor chip (12); a transformer assembly (18) made of a ferromagnetic material and installed on the base substance (15), and a sealing body. The transformer assembly (18) includes a first core section (181), a first side shield section (182), and a first upper shield section (183).

7 Claims, 8 Drawing Sheets

Fig. 5
(A)
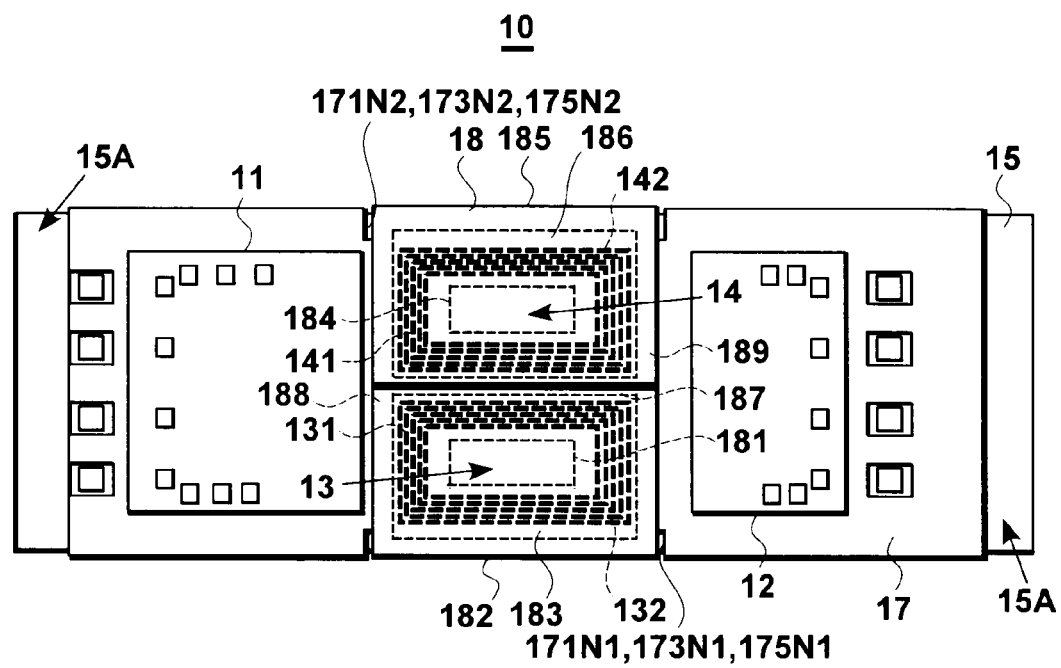
(B)
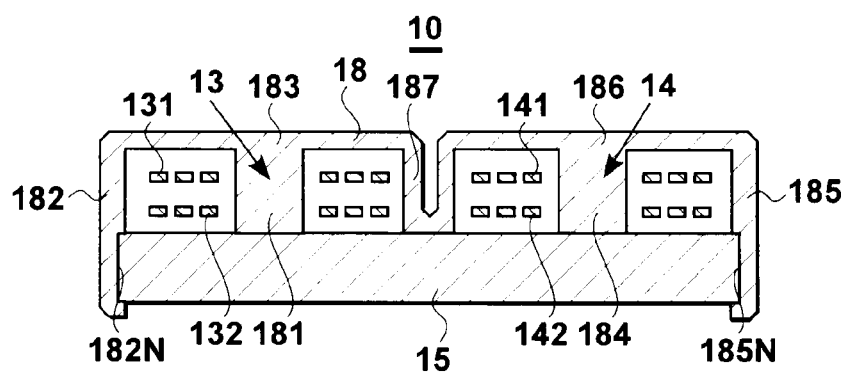

SEMICONDUCTOR DEVICE

TECHNICAL FIELD

The present invention relates to a semiconductor device, and more specifically relates to a semiconductor device which includes semiconductor chips and transformers housed in one sealing body.

BACKGROUND ART

Gas-electric highbred vehicles are now being developed in order to promote conservation of nature. Such a gas-electric highbred vehicle is provided with two kinds of batteries. One of them is a 12 V or 14 V battery (a low voltage battery) used for operating in-vehicle electronic circuits and illuminations, and for igniting an internal combustion engine. The other of them is a 200 V battery (a high voltage battery) for activating an electric motor when raised to a high voltage of 500 V to 900 V.

A power supply line for the low voltage battery is basically isolated from a power supply line for the high voltage battery. The electric motor provides a motor driver with control signals (pulse signals) from a microcomputer included in the in-vehicle electronic circuit. The motor driver controls operations of the vehicle. Detection signals (pulse signals) and so on from the motor driver are transmitted to the microcomputer.

Patent literature 1 discloses an invention in which an optical device is used to transmit the foregoing electric signals, the low voltage power supply line and the high voltage power supply line are isolated, and the electric signals are transmitted and received between high voltage and low voltage circuits.

Citation List
Patent Literature
Patent Literature 1:
Japanese Patent Laid-Open Publication No. 2001-327171

SUMMARY OF INVENTION

Technical Problem

In the invention of the Patent Literature 1, the optical device is utilized for transmission of electric signals. The optical device is made up by light emitting diodes and light receiving elements (transistors). In one of the power supply lines, the light emitting diodes convert electric signals into optical signals, and emit light. In the other power supply line, the light receiving elements receive optical signals, and convert them into electric signals. It takes 10 μsec to transmit a string of signals, for instance. Unfortunately, this suggests that transmission response of the electric signals is low in the optical device.

With the optical device, as the luminance of the light emitting diodes is reduced, the light receiving performance of the light receiving elements tends to be lowered. These phenomena will lead to lowered signal transmission response of the optical device. Further, when the optical device is operated under high temperature conditions, not only the light emitting diodes suffer from the reduced luminance but also the light receiving elements also suffer from the reduced light receiving performance. Therefore, the optical device seems to have a short life when it is applied to a gas-electric highbred vehicle.

The invention has been contemplated in order to overcome the foregoing problems of the related art, and is intended to provide a semiconductor device which can accelerate a transmission speed of electric signals, and has a long durable life.

Further, the invention aims at providing a semiconductor device which can reduce influences of internal and external noises.

Solution to Problem

According to a feature of an example of the invention, a semiconductor device includes: a base substance having a ferromagnetic material; a first semiconductor chip and a second semiconductor chip installed on the base substance; a first coil installed on the ferromagnetic material of the base substance, and electrically connected to the first semiconductor chip; a second coil placed on the first coil, electromagnetically connected to the first coil, and electrically connected to the second semiconductor chip; and a transformer assembly installed on the base substance; a sealing body covering not only a part of the base substance but also the first semiconductor chip, the second semiconductor chip, the first coil, the second coil, and the transformer assembly. The transformer assembly is made up by a first core section extending from the center of the second coil to the center of the first coil, a first side shield section extending along a part of the side surface of the second coil and a part of a side surface of the first coil, and a first upper shield section placed on the first coil and the second coil. The first core section, the first side shield section and the first upper shield section are made of ferromagnetic materials.

The foregoing semiconductor device further includes a third coil provided on the ferromagnetic material of the base substance at a position different from positions of the first coil and the second coil and electrically connected to the first semiconductor chip, and a fourth coil provided on the third coil, electromagnetically connected to the third coil, and electrically connected to the second semiconductor chip. The transformer assembly includes: a second core section extending from the center of the fourth coil to the center of the third coil; a second side shield section provided along a part of a side surface of the fourth coil and a part of a side surface of the third coil; a first upper shield section provided on the third coil and the fourth coil; and a transformer shield section provided between the first coil and the second coil, and between the third coil and the fourth coil.

The semiconductor device preferably further includes a flexible multilayered substrate which is provided on a part of the surface of the base substance, and carrying thereon the first coil, the second coil, the third coil and the fourth coil.

In the semiconductor device, the base substance and the transformer assembly are preferably made of iron-nickel alloys.

In the semiconductor device, it is preferable that the flexible multilayered substrate is provided on the part of the base substance, and includes a first insulator made of a flexible resin film, the second coil and the fourth coil provided on the first insulator, a second insulator provided on the second coil and the fourth coil and made of a flexible resin film, the first coil and the third coil provided on the second insulator, and a third insulator provided on the first coil and the third coil and made of a flexible resin film.

Further, in the semiconductor device, it is preferable that the first semiconductor chip and the second semiconductor chip stand off from each other on the multilayered substrate, and the first coil, the second coil, the third coil and the fourth coil are provided between the first semiconductor chip and the second semiconductor chip.

Still further, in the semiconductor device, it is preferable that the first coil, the second coil and the first core section of the transformer assembly configure a first transformer, and the third coil, the fourth coil and the second core section of the transformer assembly configure a second transformer.

Finally in the semiconductor device, it is preferable that the first semiconductor chips functions as a driver, the second semiconductor chip functions as a buffer, and the first transformer and the second transformer receive signals from the driver and send them to the buffer.

Advantageous Effects of Invention

The semiconductor device of the invention can accelerate the transmission speed of electric signals, and has a long durable life.

Further, the semiconductor device of the invention can reduce influences of internal and external noises.

BRIEF DESCRIPTION OF DRAWINGS

FIG. 5(A) is a top plan view of a semiconductor device in a first modified example of the example 1, with a sealing body removed, and FIG. 5(B) is a schematic sectional view of an essential part of a semiconductor device in a second modified example of the example 1 of the invention.

DESCRIPTION OF EXAMPLES

Figure 1:
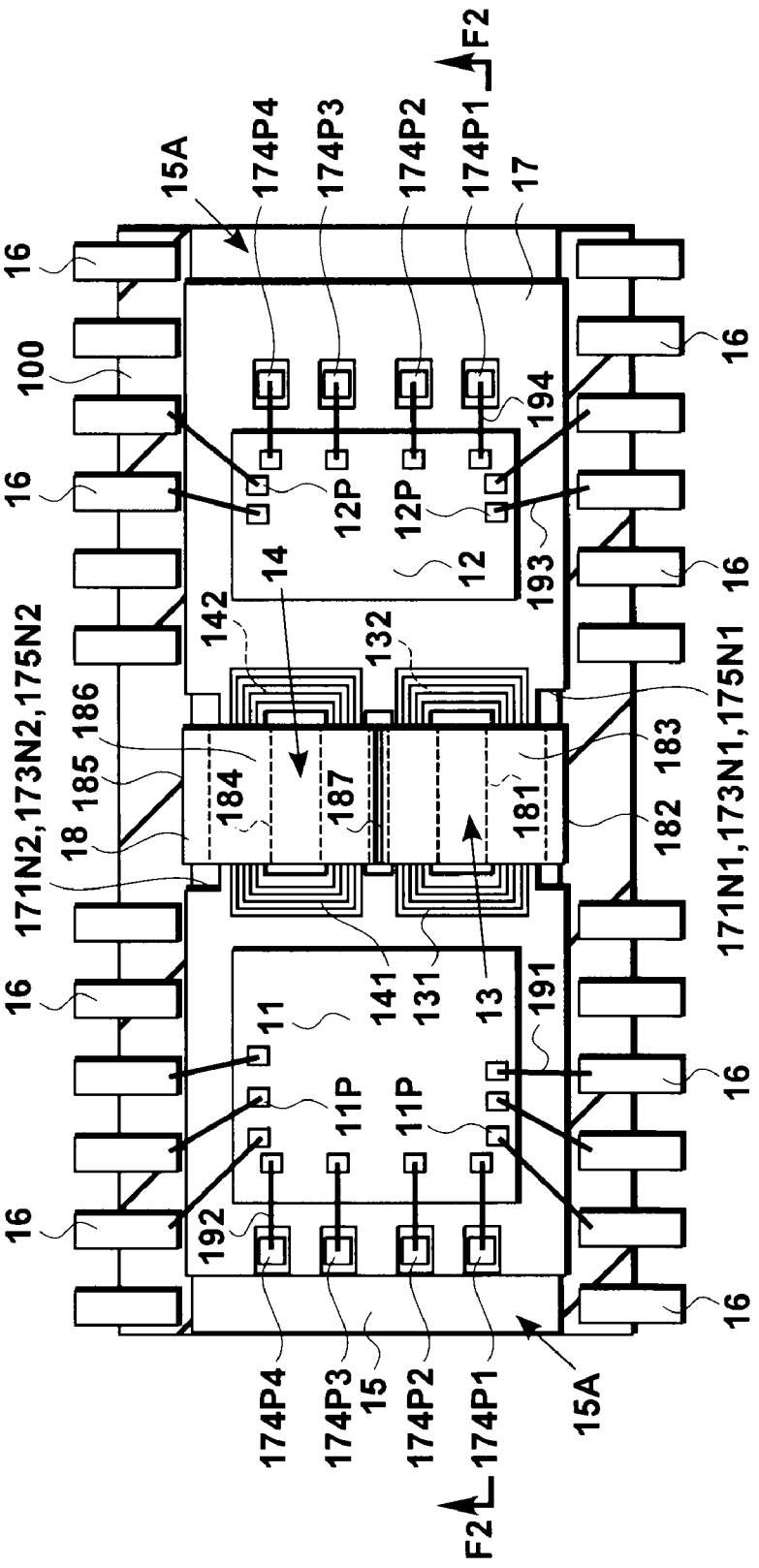
FIG. 1 is a top plan view of a semiconductor device according to an example 1 of the invention, with a part of components, a sealing body, removed.

The invention will be described with reference to the drawings, in which like or corresponding parts are denoted by like or corresponding reference numerals. The drawings are schematic, and shapes of components sometime differ from those of actual components. Further, different scales may be used in some drawings.

While the invention will be described by means of specific examples and applications thereof, numerous modifications and variations could be made thereto without departing from the scope of the invention set forth in the claims.

Example 1

In an example 1, the invention is applied to a semiconductor device (a highbred vehicle insulating IC), which is provided in an in-vehicle electronic circuit system, and constitutes an insulated port for transmitting electric signals to circuits operating at different voltage levels.

Highbred In-Vehicle Electronic Circuit System

Figure 3:
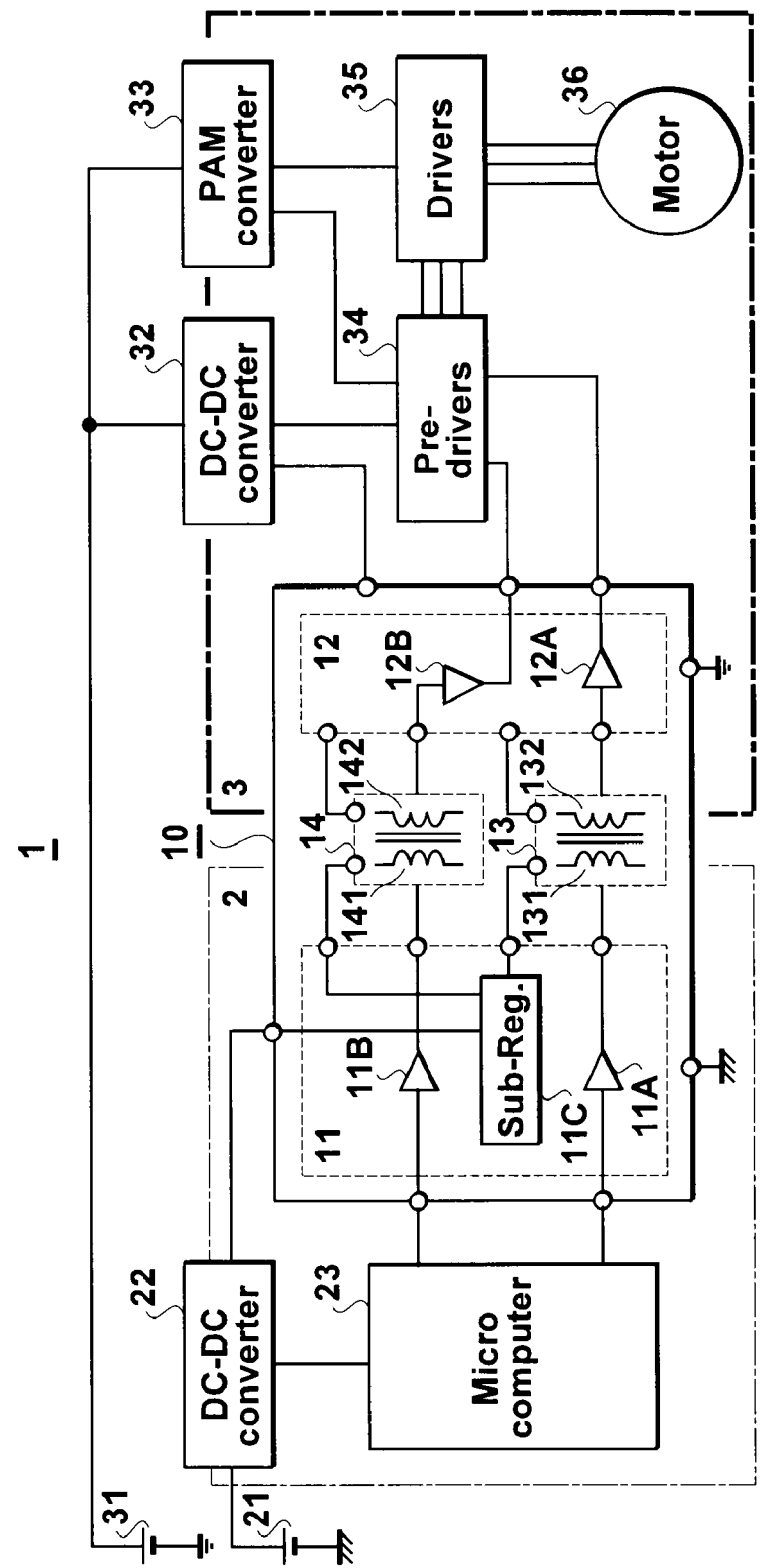
FIG. 3 is a block diagram of a system circuit in which the semiconductor device is installed.

Referring to FIG. 3, the semiconductor device 10 is incorporated in an in-vehicle circuit system 1 of the highbred vehicle. As partly shown, the in-vehicle circuit system 1 is provided with a low voltage battery 21, a low voltage circuit 2 receiving low voltage power from the low voltage battery 21, a high voltage battery 31, and a high voltage circuit 3 receiving high voltage power from the high voltage battery 31. The semiconductor device 10 is disposed between the low voltage circuit 2 and the high voltage circuit 3 which are isolated from each other, and transmits electric signals between the low voltage circuit 2 and the high voltage circuit 3.

In the example 1, the low voltage battery 21 is a 12 V or 24 V battery, which supplies power to operate the in-vehicle electric circuits, and illumination devices such as headlights and turn signals, and to ignite an internal combustion engine such as a petrol engine or a diesel engine. The high voltage battery 31 is a 200 V inverter battery, which supplies power to electric motors for activating the highbred vehicle, and circuits for controlling the operation of the electric motors.

The low voltage circuit 2 includes a DC-DC converter 22 and a microcomputer 23. The DC-DC converter 22 is connected to the low voltage battery 21, receives low voltage power, and converts it to 5 V DC power to be used by the low voltage circuit 2, for instance. The microcomputer 23 receives the DC power converted by the DC-DC converter 22. The 5 V DC power converted by the converter 22 is also supplied to the semiconductor device 10. The microcomputer 23 outputs control signals (pulse signals) for controlling at least an electric motor 36 disposed in the high voltage circuit 3.

In the example 1, the high voltage circuit 3 is provided with a DC-DC converter 32, a PAM (pulse amplitude modulation) converter 33, a front-end driver 34, a driver 35, and the electric motor 36 for driving the highbred vehicle. The DC-DC converter 32 is connected to the high voltage battery 31, receives the high voltage DC power, and converts it to DC power having a voltage level to be used by the high voltage circuit 3. The PAM converter 33 is connected to the high voltage battery 31 in order to receive the high voltage DC power, and controls revolution speeds of the electric motor 36. The front-end driver 34 controls the driver 35 in response to the control signal from the microcomputer 23. The driver 35 activates the electric motor 36 and controls the rotation of the electric motor 36 in response to the control signals from the front-end driver 34 and the PAM converter 33. In this state, the electric motor 36 enables the highbred vehicle to run using the drive force of the electric motor 36 in place of the drive force of the internal combustion engine.

In this example, the low voltage circuit 2 and the high voltage circuit 3 have a 2.5 kV/min to 3.0 kV/min withstand voltage between them (between the low voltage power supply line and the high voltage power supply line). The withstand voltage is not always limited to the foregoing value.

Circuit Configuration of Semiconductor Device

Referring to FIG. 3, the semiconductor circuit 10 of the example 1 includes a first semiconductor chip 11, a second semiconductor chip 12, a first transformer 13, and a second transformer 14.

The first semiconductor chip 11 is a monolithic control IC (MIC), includes a buffer (inverter) 11A, a buffer (inverter) 11B, and a substrate regulator 11C, and functions as a driver IC. Inputs terminals of the buffers 11A and 11B are connected to the microcomputer 23 of the low voltage circuit 2. An input terminal of the substrate regulator 11C is connected to the DC-DC converter 22.

The second semiconductor chip 12 is also a monolithic control IC (MIC), includes a buffer (inverter) 12A and a buffer (inverter) 12B, performs wave shaping of the control signal from the first semiconductor chip 11, and functions as a buffer for sending the wave-shaped control signal to the high voltage circuit 3. Output terminals of the buffers 12A and 12B are connected to the front-end driver 34 of the high voltage circuit 3.

The first and second transformers 13 and 14 receive the control signals (electric signals) from the microcomputer 23 of the low voltage circuit 2 via the first semiconductor chip 11, and transfer the control signals to the second semiconductor chip 12. The control signals sent to the second semiconductor chip 12 are transmitted to the front-end driver 34 of the high voltage circuit 3.

The first transformer 13 includes a first coil 131 connected to the output terminal of the buffer 11A of the first semiconductor chip 11, and a second coil 132 electromagnetically connected to the first coil 131 and connected to the input terminal of the buffer 12A of the second semiconductor chip 12. The second transformer 14 includes a third coil 141 connected to the output terminal of the buffer 11B of the first semiconductor chip 11, and a fourth coil 142 electromagnetically connected to the third coil 141 and connected to the input terminal of the buffer 12B of the second semiconductor chip 12.

Structure of Semiconductor Device

Figure 2:
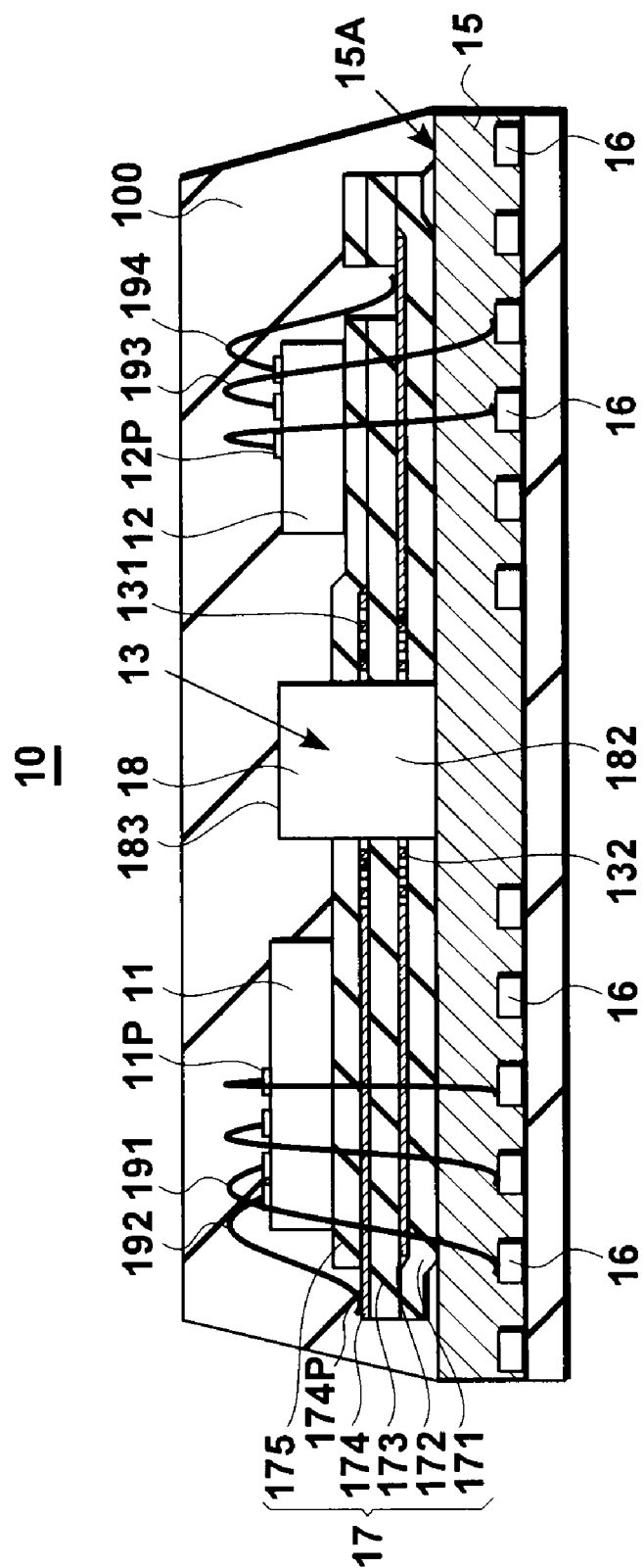
FIG. 2 is a sectional view of the semiconductor device of the example 1 (taken along line F2-F2 shown in FIG. 1).

As shown in FIG. 1 and FIG. 2, the semiconductor device 10 is made up by the following: a base substance 15 having a ferromagnetic material; the first semiconductor chip 11 and the second semiconductor chip 12 placed on the base substance 15; the first coil 131 placed on the ferromagnetic material of the base substance 15 and electrically connected to the first semiconductor chip 11; the second coil 132 placed on the first coil 131, and electromagnetically connected to the first coil 131 and electrically connected to the second semiconductor chip 12; a first core section 181 extending between the center of the second coil 132 and the center of the first coil 131; a first side shield section 182 disposed along a part of a side surface of the second coil 132 and a part of a side surface of the first coil 131; a first upper shield section 183 placed on the first and second coils 131 and 132; a transformer assembly 18 attached on the base substance 15; and a sealing body 100 extending over a part of the base substance 15, first and second semiconductor chips 11 and 12, first and second coils 131 and 132, and transformer assembly 18. The first side shield section 182 and the first upper shield section 183 are made of ferromagnetic materials.

The semiconductor device 10 further includes: the third coil 141 positioned on the ferromagnetic material of the base substance 15 at a region which differs from regions for the first and second coils 131 and 132, the coil 141 being electrically connected to the first semiconductor chip 11; and the fourth coil 142 extending over the third coil 141 and electrically connected to the second semiconductor chip 12. The transformer assembly 18 includes: a second core section 184 extending between the center of the fourth coil 142 and the center of the third coil 141; a second side shield section 185 extending along a part of the side surface of the fourth coil 142 and a part of the side surface of the third coil 141; a second upper shield section 186 extending over the third and fourth coils 141 and 142; and a transformer shield section 187 positioned between the first and second coils 131 and 132, and between the third and fourth coils 141 and 142.

The base substance (under frame) 15 serves as a base plate or a die pad for installing the first and second semiconductor chips 11 and 12, and the first and second transformers 13 and 14. Further, the base substance 15 includes a ferromagnetic material on which the first and second transformers 13 and 14 are installed, and magnetically protects and shields the semiconductor device 10 against internal and external influences. With the highbred vehicle (not always limited to the highbred vehicle), high voltages are frequently generated in response to the ignition of the internal combustion engine, so that noises are often caused. The base substance 15 is effective in shielding the semiconductor device 10 against noise. Further, the base substance 15 functions as a heat sink for improving heat radiation of the semiconductor device 10.

In the example 1, the base substance 15 is a rectangular plate. Referring to FIG. 1 and FIG. 2, the first semiconductor chip 11 is present at the left, and the second semiconductor chip 12 is present at the right side, along the length of the base substance 15. The first and second transformers 13 and 14 are positioned at the center of and across the base substance 15, i.e. are orthogonal to the shorter sides of the base substance 15.

The base substance 15 is ferromagnetic, and is made of an iron-nickel alloy, preferably a so-called 42-alloy containing 58% iron and 42% nickel, which is popular in the semiconductor technology field. In this example, the base substance 15 is entirely ferromagnetic. Alternatively, it is possible to use a 52-alloy which is ferromagnetic and serves as a die pad. For instance, the base substance 15 may be 20.0 mm to 23.0 mm long, and 7.0 mm to 7.3 mm wide. When entirely covered, the base substance 15 is 0.18 mm to 0.22 mm thick. Needless to say, the foregoing dimensions are not always prerequisite. Further, the base substance 15 is preferably 0.75 mm to 0.85 mm thick, when it serves as the heat sink with a rear surface thereof exposed to the surface where the first semiconductor chip 11 and so on are installed.

A plurality of leads 16 are provided on two longer sides of the base substance 15. The semiconductor device 10 adopts a dual line structure in which the leads 16 are arranged in two rows. Alternatively, the semiconductor device 10 may adopt a single line structure in which the leads are arranged in one row, or may adopt a structure in which the leads 16 are arranged on all of four sides of the base substance 15. The leads 16 are made of a material similar to that the material of the base substance 15. Each lead 16 is 0.18 mm to 022 mm thick, for instance.

In the example 1, the first and second semiconductor chips 11 and 12 are bare silicon chips, on which are provided circuits. The circuits are complementary transistors or BCDs which are activated by 5 V (or 2.5 V to 3.3 V) low voltage power. The term "complementary transistor" is used to represent complementary insulated-gate field effect transistors (IGFET). The IGFETs are at least MOSFETs (metal oxide semiconductor field effect transistors), and MISFETs (metal insulated semiconductor field effect transistors). The term "BCDs" covers bipolar transistors, complementary transistors, and depression transistors.

Figure 4:
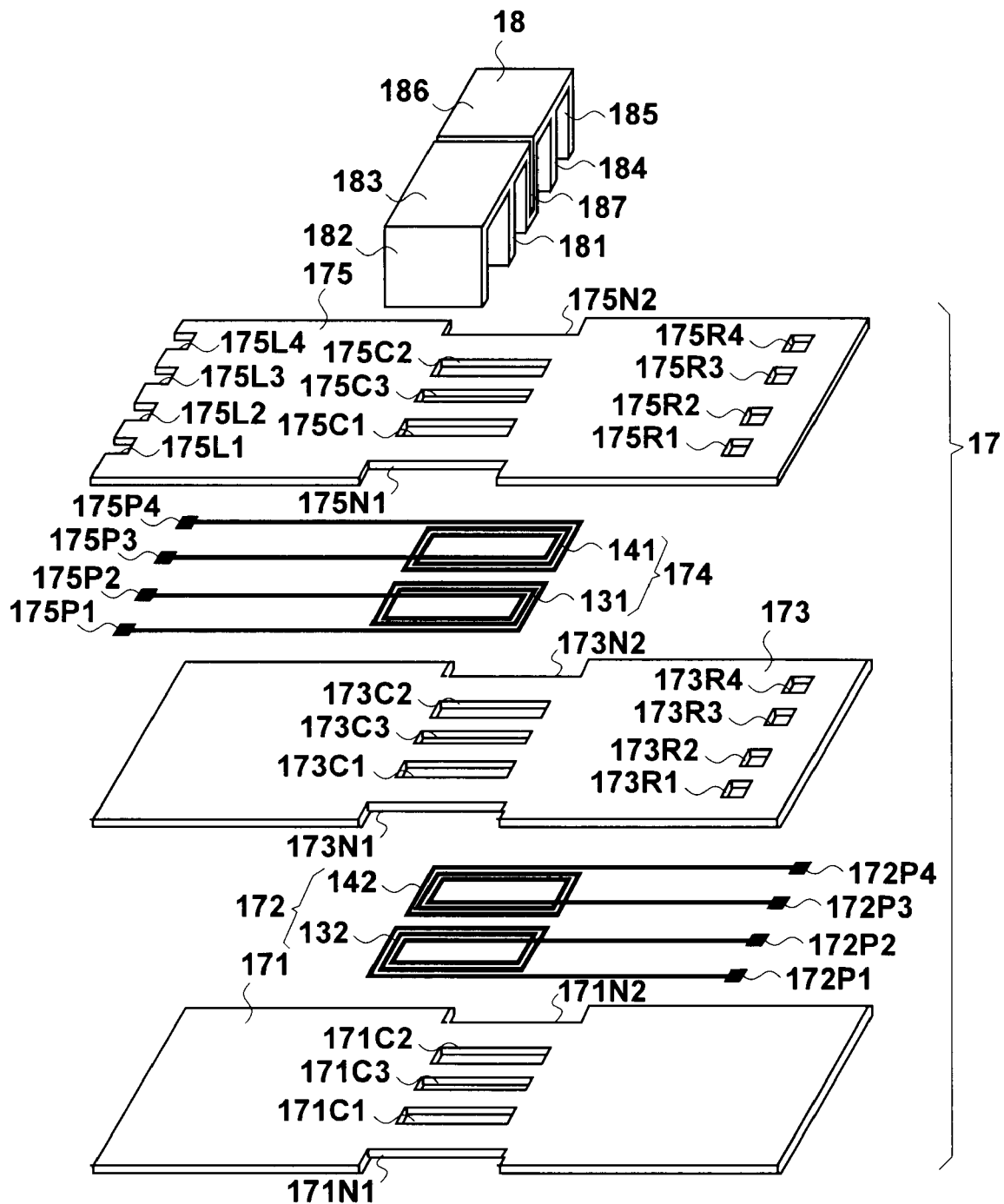
FIG. 4 is an exploded perspective view of an essential part of the semiconductor device of the example 1.

The first and second semiconductor chips 11 and 12 are installed on the base substance 15 via a multilayered substrate 17. The multilayered substrate 17 is flexible, and is placed on a surface 15A of the base substance 15 as shown in FIG. 1, FIG. 2 and FIG. 4. The multilayered substrate 17 includes: a first insulator 171 made of a flexible resin film; the second and fourth coils 132 and 142 placed on the first insulator 172; a second insulator 173 placed on the second and fourth coils 132 and 142 and made of a flexible resin film; the first and second coils 131 and 141 placed on the second insulator 173; and a third insulator 175 placed on the first and third coils 131 and 141 and made up by a flexible resin film. The second and fourth coils 132 and 142 are made up by a first conductor 172 extending between the first and second insulators 171 and 173. The first and third coils 131 and 141 are made up by a second conductor 174 extending between the second and third insulators 173 and 175. In short, the substrate 17 is a flexible multilayer wiring substrate which includes the first, second and third insulators 171, 173 and 175, and the first and second conductors 172 and 174, which are alternately piled.

The first insulator 171 is made of an insulating flexible polyimide film which is 10 µm to 15 µm, preferably 12 µm, thick. The second insulator 173 is made of an insulating flexible polyimide film which is similar to that of the first insulator 171. For instance, the second insulator 173 is 45 µm to 55 µm, preferably 50 µm, thick in order to electrically and magnetically insulate the first and second coils 131 and 132, and the third and fourth coils 141 and 142. The third insulator 175 is made of an insulating flexible film similar to that of the first insulator 171.

The first conductor 172 is made of very conductive and flexible copper foil or copper alloy foil, and is 25 µm to 35 µm, preferably 30 µm, thick, for instance. The second coil 132 has a coil pattern (output coil pattern) which is formed by the first conductor 172 spirally arranged at the center of the first insulator 171 (the center of the base substance 15). Referring to FIGS. 1, 2 and 4, one end of the second coil 132 is pulled out to a right end of the longer side of the substrate 17, and is connected to a pad 172P of the first conductor 172 (i.e. at the second coil 132 and the pad 172P1 are a single-piece member). Similarly, the other end of the second coil 132 is pulled out to the right end of the longer side of the substrate 17, and is connected to a pad 172P2 of the first conductor 172. Although not shown, another insulator which is made of a resin material similar to that of the first insulator 171 is placed at an intersection of the second coil 132 in order to accomplish insulation. The material of the insulator is as thick as the first insulator 171.

Similarly to the second coil 132, the fourth coil 142 has a coil pattern (output coil pattern) at the center of the first insulator 171. One end of the fourth coil 142 is pulled out to a right end of the longer side of the substrate 17, and is connected to a pad 172P3 made of the first conductor 172. The other end of the fourth coil 142 is pulled out to the right end of the substrate 17, and is connected to a pad 172P4. Although not shown, another insulator is placed at an intersection of the fourth coil 142 in order to accomplish the insulation.

The second conductor 174 is made of extensively conductive and flexible copper foil or copper alloy foil, and is 25 µm to 35 µm, preferably 30 µm, thick, for instance. The first coil 131 has a coil pattern (output coil pattern) which is formed by the second conductor 174 spirally arranged at the center of the second insulator 173 (at the center of the base substance 15). Referring to FIG. 1, FIG. 2 and FIG. 4, one end of the first coil 131 is pulled out to a right end of the longer side of the substrate 17, and is connected to a pad 174P1 of the first conductor 172 (i.e. the second coil 132 and the pad 174P1 is a single-piece member). Similarly, the other end of the first coil 131 is pulled out to the right end of the longer side of the substrate 17, and is connected to a pad 174P2 of the second conductor 174. Although not shown, another insulator which is made of a resin material similar to that of the first insulator 171 is placed at an intersection of the second coil 132 in order to accomplish insulation. This insulator is as thick as the first insulator 171.

The third coil 141 has a coil pattern (input coil pattern) which is similar to that of the first coil 131 at the center of the second insulator 173. One end of the third coil 141 is pulled out to the right end of the longer side of the substrate 17, and is connected to a pad 172P3 made of the second conductor 174. The other end of the third coil 141 is pulled out to the right end of the substrate 17, and is connected to a pad 174P4. Although not shown, a further insulator is placed at an intersection of the third coil 141 in order to accomplish the insulation.

The substrate 17 includes the first and second insulators 171 and 173 and the third insulator 175 which are made of flexible polyimide resin films, and are thinned compared to non-flexible substrate such as an epoxy resin substrate. This is effective in reducing a thickness of the semiconductor device 10 (i.e. the sealing body 100).

Referring to FIG. 1, FIG. 2 and FIG. 4, the transformer assembly 18 is in the shape of a comb, and includes: a first upper shield section 183 and a second upper shield section 186 which face the surface 15A of the base substance 15; and a first side shield section 182, a first core section 181, a transformer shield section 187, a second core section 184, and a second side shield section 185. All of the foregoing components are in the shape of thin teeth and face the surface 15A of the base substance 15. The thin-tooth shaped members are thick along the length of the base substance 15.

Specifically, one end of the shorter side of the first upper shield section 183 and one end of the shorter side of the second upper shield section 186 are connected via the transformer shield section 187, and extend in the short side direction.

The transformer shield section 187 is in the shape of the letter U, i.e. stands out from one end of the first upper shield section 183 toward the surface 15A of the base substance 15, and folds back toward one end of the second upper shield section 186. The transformer shield section 187 passes through the following openings and reaches the surface 15A of the base substance 15: an opening 175C3 at the center of the third insulator 187; an opening 173C3 at the center of the second insulator 175; and an opening 171C3 at the center of the first insulator 171. The openings 175C3, 173C3 and 171C3 are aligned. In this state, the transformer shield section 187 is simply in contact with the surface 15A, or is soldered or is connected using brazing filler metal. The transformer shield section 187 is in full contact with the surface 15A, and suppresses mutual interference caused by a magnetic field which is present between the first transformer 13 and the second transformer 14.

The first side shield section 182 vertically stands out from the other end of the first upper shield section 183 toward the surface 15A of the base substance 15. The first side shield section 182 comes into contact with the surface 15A via an angular cut-out 175N1 at the center of one of longer sides of the third insulator 175, an angular cut-out 173N1 at the center of one of longer sides of the second insulator 175, and an angular cut-out 171N1 at the center of one of longer sides of the first insulator 171. The angular cut-outs 175N1, 173N1 and 171N1 are aligned. The first side shield section 182 is brought into contact with the surface 15A of the base substance 15 as described above.

The second side shield section 185 vertically stands out from the other end of the second upper shield section 186 toward the surface 15A of the base substance 15. The second side shield section 185 is brought into contact with the surface 15A via an angular cut-out 175N2 at the center of the other longer side of the third insulator 175, an angular cut-out 173N2 at the center of the other side of the second insulator 175, and an angular cut-out 171N2 at the center of the other side of the first insulator 171. The angular cut-outs 175N2, 173N2 and 171N2 are aligned.

The first core section 181 perpendicularly stands out toward the surface 15A of the base substance 15 from the center of the first upper shield section 183, i.e. at the center between the first side shield section 182 and the transformer shield section 187. The first core section 181 is brought into contact with the surface 15A of the base substance 15 via an opening 175C1 made between the opening 175C3 and the rectangular cut-out 175N1, an opening 173C1 on the second insulator 175, and an opening 171C1 on the first insulator 171. The openings 175C1, 173C1 and 171C1 are aligned. In short, the first core section 181 passes through the centers of the first and second coils 131 and 132.

The second core section 184 perpendicularly stands out toward the surface 15A of the base substance 15 from the center of the second upper shield section 186, i.e. at the center between the second side shield section 185 and the transformer shield section 187. The second core section 184 is brought into contact with the surface 15A of the base substance 15 via an opening 175C2 made between the opening 175C3 of the third insulator 175 and the rectangular cut-out 175N2, an opening 173C2 on the second insulator 175, and an opening 171C2 on the first insulator 171. The openings 175C2, 173C2 and 171C3 are aligned. In short, the second core section 184 passes through the centers of the third and fourth coils 141 and 142.

In the transformer assembly 18 of the example 1, the first core section 181, first side shield section 182, first upper shield section 183, second core section 184, second side shield section 185, second upper shield section 186 and transformer shield section 187 are made as a single piece member. Basically, the transformer assembly 18 is made of a ferromagnetic material extending over the first and second coils 13 and 14. The transformer assembly 18 may be made of material same as that of the base substance 15 such as an iron-nickel alloy, preferably a 42-alloy, and is prepared by press work, etching or a combination of press work and etching. When incorporated in the semiconductor device 10, the transformer assembly 18 is 0.2 mm to 0.4 mm high (to the upper surface of the first upper shield section 183), and 0.1 mm to 0.3 mm thick, for instance.

The first transformer 13 includes the first coil 131, the second coil 132, and the first core section 181. In the first transformer 13, the shorter peripheral surfaces (two peripheral surfaces) of the base substance 15 are covered by the transformer assembly 18 (i.e. the first side shield section 182, first upper shield section 183 and transformer shield section 187), thereby shield sectioning the first transformer 13 from electric or magnetic noises from inner or outer spaces. In the similar manner, the second transformer 14 includes the third coil 141, fourth coil 142, and second core section 184. In the second transformer 14, the shorter peripheral surfaces (two peripheral surfaces) of the base substance 15 are covered by the transformer assembly 18 (i.e. the first side shield section 182, first upper shield section 183 and transformer shield section 187), thereby protecting the second transformer 14 against electric or magnetic noise from inner or outer spaces. Further, an additional transformer shield section 187 is also provided between the first and second transformers 13 and 14, so that the transformers 13 and 14 are also shielded. In the example 1, the transformer assembly 18 functions not only as the core section 181 of the first transformer 13 but also as the second core section 184 of the second transformer 14. The transformer assembly 18 functions as a shield.

A bonding pad 11P of the first semiconductor chip 11 is electrically connected to an inner lead of the lead 16 via a wire 191. Further, the bonding pad 11P is electrically connected via a wire 192 to terminals 174P1 and 174P2 of the first coil 131 of the first transformer 13, and terminals 174P3 and P174P4 of the third coil 141 of the second transformer 14. The wire 192 is connected to the terminals 174P1 to 174P4 via openings 175L1 to 175L4 made at the left end of the third insulator 175. A bonding pad 12P of the second semiconductor chip 12 is connected to the inner lead of the lead 16 via a wire 193. Further, the bonding pad 12P is electrically connected via a wire 194 to terminals 172R1 and 172R2 of the first coil 131 of the first transformer 13, and terminals 172R3 and P172R4 of the fourth coil 142 of the second transformer 14. The wire 194 is connected to terminals 172R1 to 172R4 via openings 175R1 to 175R4 at the right end of the third insulator 175, and via openings 173R1 to 173R4 at the right end of the second insulator 173. The openings 175R1 to 175R4 and 173R1 to 173R4 are aligned. The wires 191 to 194 are gold wires in the example 1.

The sealing body 100 covers the base substance 15, inner leads of the lead 16, first semiconductor chip 11, second semiconductor chip 12, and transformer assembly 18 (first transformer 13 and second transformer 14). When covering the base substance 15, the sealing body 100 also entirely extends over the rear surface of the base substance 15 as well as all of the foregoing components. Otherwise, the sealing body 100 covers the foregoing components except for the rear surface of the base substance 15 when the base substance 15 is also used as the heat sink). The sealing body 100 is made of epoxy resin prepared by the transfer mold process, for instance. In this example, the sealing body 100 is 24.0 mm to 26.0 mm long along the longer side of the base substance 15, and 7.0 mm to 8.0 mm long along the shorter side of the base substance 15. The sealing body 100 is 1.6 mm to 2.0 mm thick.

Features of Semiconductor Device

In the semiconductor device 10 of the example 1, the first transformer 13 and the second transformers 14 are applied to transmit the electric signals between the first semiconductor chip 11 and the second semiconductor chip 12, so that signal transmission can be accelerated using the electromagnetic induction. For instance, the signals can be transmitted by using the first and second transformers 13 and 14 at an accelerated speed of 50 nsec to 100 nsec.

Further, the use of the first and second transformers 13 and 14 enables the semiconductor device 10 to operate without a reduced transmission speed of the electric signals due to characteristic degradation at a high temperature. Such a phenomenon is observed in an optical device. Therefore, the semiconductor device 10 is usable for a long period of time.

Still further, since the first and second transformers 13 and 14 are protected by the base substance 15 and the transformer assembly 18, the semiconductor device 10 can be protected against internal and external noises.

In accordance with the example 1, the transformer assembly 18 includes the first core section 181 for the first transformer 13, and the second core section 184 for the second transformer 14, so that the transformer assembly 18 has a shield function, which is effective in reducing the number of components, and in simplifying the configuration of the semiconductor device 10.

First Modified Example

In a first modified example, the semiconductor device 10 has a transformer assembly 18 whose structure is different from the foregoing transformer assembly 18.

Referring to FIG. 5(A), the transformer assembly 18 of the first modified example includes a third side shield section 188 and a fourth side shield section 189. The third side shield section 188 extends along the side surfaces of the first, second, third and fourth coils 131, 132, 141 and 142, covers the first and second upper shield sections 183 and 186, and reaches the surface 15A of the base substance 15. The first to fourth coils 131, 132, 141 and 142 face the semiconductor chip 11. In short, the third side shield section 188 is positioned among the first semiconductor chip 11 and the first and second transformers 13 and 14. The fourth side shield section 189 extends along the side surfaces of the first, second, third and fourth coils 131, 132, 141 and 142, extends over the first and second upper shield sections 183 and 186, and reach the surface 15A of the base substance 15. In short, the fourth side shield section 188 is positioned among the second semiconductor chip 12, the first transformer 13 and the second transformer 14.

In the transformer assembly 18 of the first modified example, the third and fourth side shield sections 188 and 189 are integral with the first and second upper shield sections 183 and 186 and so on similarly to the transformer assembly 18 of the example 1.

With the semiconductor device 10 of the first modified example, the first and second side shield sections 182 and 185 of the transformer assembly 18 extend over the first and second transformers 13 and 14 along the two shorter sides of the base substance 15, and extend over the third and fourth side shield sections 188 and 189 along the two longer sides of the base substance 15. In other words, the first and second transformers 13 and 14 shield the base substance 15 along the four sides thereof. This is effective in further suppressing influence of inner and outer noises.

Second Modified Example

In a second modified example of the example 1, the transformer assembly 18 can be easily installed on the base substance 15 of the semiconductor device 10.

Referring to FIG. 5(B), the first side shield section 182 of the transformer assembly 18 extends to the rear surface of the base substance 15, and has a rectangular cut-out 182N. The rectangular recess 182N is present on an inner surface of the first side shield section 182, and is brought into contact with one end of the base substance 15. The second side shield section 185 extends to the rear surface of the base substance 15, and has a rectangular recess 185N. The rectangular recess 185N is present on the inner surface of the second side shield section 185, and is brought into contact with the other end of the base substance 15. The transformer assembly 18 can be easily attached to the base substance 15 by engaging the base substance 15 with the rectangular recesses 182N and 185N.

Example 2

In an example 2 of the invention, the semiconductor device 10 includes a transformer assembly 18 of which structure is modified in order to enhance the shielding performance.

Figure 6:
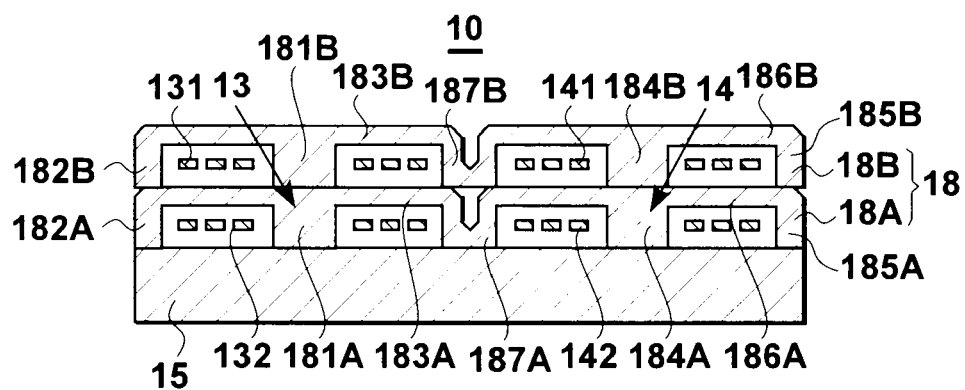
FIG. 6 is a schematic sectional view of an essential part of a semiconductor device in an example 2 of the invention.
Figure 7:
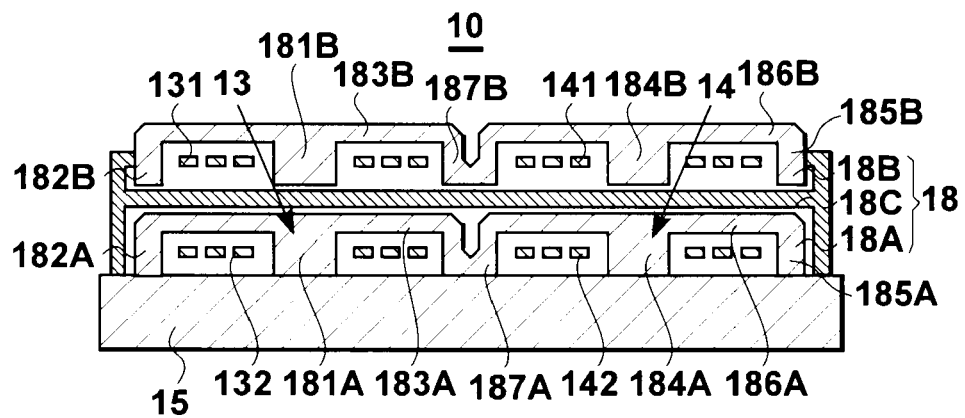
FIG. 7 is a schematic sectional view of an essential part of a semiconductor device in a modified example of the example 2 of the invention.

As shown in FIG. 6, the transformer assembly 18 of the example 2 has a first transformer assembly 18A and a second transformer assembly 18B placed on the first transformer assembly 18A.

The first transformer assembly 18A of lower of the transformer assembly 18 includes: a first core section 181A provided at the center of the second coil 132 of the first transformer 13; a first side shield section 182A provided along one side surface of the second coil 132; a first upper shield section 183A provided on the upper surface of the second coil 132; a second core section 184A provided at the center of the fourth coil 142 of the second transformer 14; a second side shield section 185A provided along the side surface of the fourth coil 142; a second upper shield section 186A provided on the upper surface of the fourth coil 142; and a transformer shield section 187A provided between the second coil 132 and the fourth coil 142. The third coil 132 and fourth coil 142 are covered in two directions (or in four directions) by the base substance 15 and the transformer assembly 18A.

The second transformer assembly 18B of upper of the transformer assembly 18 includes: a first core section 181B provided at the center of the second coil 131 of the first transformer 13; a first side shield section 182B provided along the side surface of the first coil 131; a first upper shield section 183B provided on the upper surface of the first coil 131; a second core section 184B provided at the center of the third coil 141 of the second transformer 14; a second side shield section 185B provided along the side surface of the third coil 141; a second upper shield section 186B provided on the upper surface of the third coil 141; and a transformer shield section 187B provided between the first coil 131 and the third coil 141. The first coil 131 and third coil 141 are covered in two directions (or in four directions) by the base substance 15 and the transformer assembly 18B. Further, a first upper shield section 183A of the first transformer assembly 18A is provided between the first coil 131 and the second coil 132, and shields the coils 131 and 132. Still further, a second upper shield section 186A of the first transformer assembly 18A is provided between the third coil 141 and the fourth coil 142, and shields the coils 141 and 142.

The semiconductor device 10 of modified example of the example 2 is as advantageous as the semiconductor device 10 of the example 1. Further, the semiconductor device 10 of this example 2 includes the transformer assembly 18 composed of the first transformer assembly 18A and the second transformer assembly 18B. The transformer assembly 18 can cover the first and second coils 131 and 132 of the first transformer 13, the third and fourth coils 141 and 142 of the second transformer 14. This is effective in improving the shielding performance of the first and second transformers 13 and 14, and in extensively suppressing influences of inner and outer noises.

Modified Example

In this modified example, the transformer assembly 18 of the semiconductor device 10 of the example 2 is modified.

In a modified example, the transformer assembly 18 of the semiconductor device 10 includes a shield reinforcement 18C, which is provided between the first transformer assembly 18A and the second transformer assembly 18B, and extends on side surfaces of the first transformer assembly 18A and the second transformer assembly 18B. The shield reinforcement 18C may be made of a copper material.

The semiconductor device 10 of the modified example is as advantageous as the semiconductor device of the example 2. The shield reinforcement 18C is effective in extensively shielding the first and second transformers 13 and 14, and in suppressing influences of inner and outer noises.

Example 3

In an example 3 of the invention, the transformer assembly 18 of the semiconductor device 10 is made of a material which is different from that of the example 2.

Figure 8:
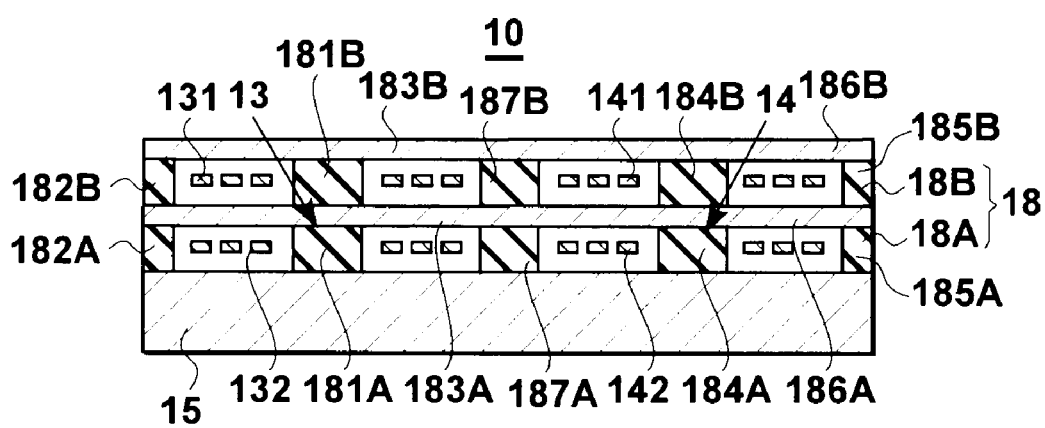
FIG. 8 is a schematic sectional view of an essential part of a semiconductor device of an example 3 of the invention.

Referring to FIG. 8, in the transformer assembly 18 of the example 3, different materials are used for the first transformer assembly 18A and the second transformer assembly 18B. In the first transformer assembly 18A, a first core section 181A, the second side shield section 182A, a second core section 184A, a second side shield section 185A, a transformer shield section 187A are made of a material which differs from the materials of the first upper shield section 183A and the second upper shield section 186A. Similarly, in the second transformer assembly 18B, a first core section 181B, a first side shield section 182B, a second core section 184B, a second side shield section 185B and a transformer shield section 187B are made of a material which differs from the material of the first upper shield section 183B and the second upper shield section 186B.

The first upper shield sections 183A and 183B, and second upper shield sections 186A and 186B are made of the ferromagnetic iron-nickel alloy plate, preferably a 42-alloy plate similarly to the transformer assembly 18 of the example 2.

The core sections 181A and 181B, the first side shield sections 182A and 182B, the second core sections 184A and 184B, the second side shield sections 185A and 185B, and the transformer shield sections 187A and 187B are made of resin which is same as that of the transformer assembly 18 of the example 2, but contains ferromagnetic powders. Epoxy resin, polyimide resin or the like is usable. The ferromagnetic powders may be preferably one of or combination of two or more of the following: iron, cobalt, nickel, ferrite or the like.

The semiconductor device 10 of the example 3 is advantageous as the semiconductor device 10 of the example 2. In the example 3, a part of the transformer assembly 18 is made of the resin, which enables the transformer assembly 18 having a complicated shape to be made with ease. Specifically, if the first core section 181A made of the resin containing the ferromagnetic powder is prepared on the surface 15A of the base substance 15 beforehand, the first transformer assembly 18A can be fabricated by placing a plate which serves as the first upper shield section 183 and so on. The transformer assembly 18 can be completed by making the second transformer assembly 18B as mentioned above.

Modified Example

In this modified example of the example 3, the semiconductor device 10 has a transformer assembly 18 whose structure is modified.

Figure 9:
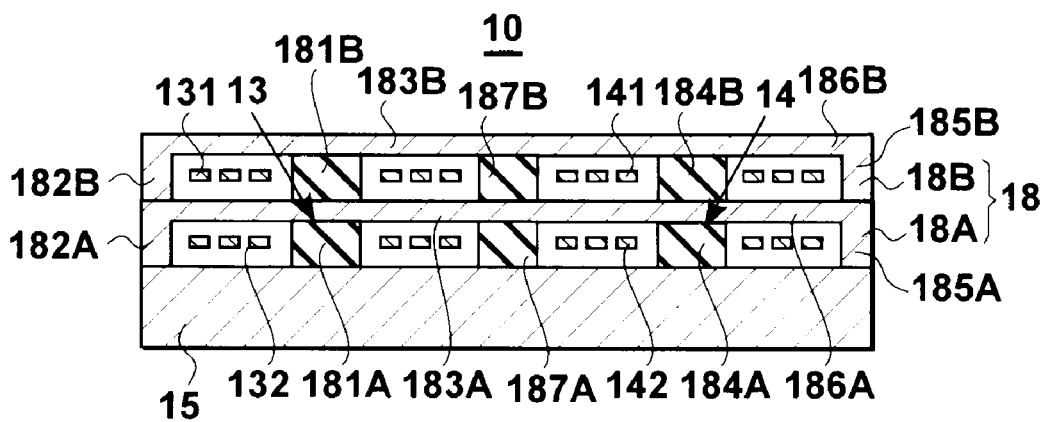
FIG. 9 is a schematic sectional view of an essential part of a semiconductor device in a modified example of the example 3 of the invention.

Referring to FIG. 9, in the transformer assembly 18, different materials are used for the first transformer assembly 18A and the second transformer assembly 18B. In the first transformer assembly 18A, the first core section 181A, the second core section 184A and the transformer shield section 187A are made of a material which differs from the material of the first and second side shield sections 182A and 185A, and the first and second upper shield sections 183A and 186A. In the second transformer assembly 18B, the first core section 181B, the second core section 184B and the transformer shield section 187B are made of a material which differs from a material of the first and second side shield sections 182B and 185B, and the first and second upper shield sections 183B and 186A.

The first side shield sections 182A and 182B, the second side shield sections 185A and 185B, the first upper shield sections 183A and 183B, and the second upper shield sections 186A and 186B are made of ferromagnetic iron-nickel alloy plates and mentioned previously. The first side shield section 182A and the second side shield section 185A are formed for example by folding or press working for the first upper shield section 183A and the second upper shield section 186A. In the same way, the upper shield section 182B and the second upper shield section 185B are formed for example by folding or press working for the first upper shield section 183B and the second upper shield section 186B.

The first core sections 181A and 181B, the second core sections 184A and 184B, and the transformer shield sections 187A and 187B are made of resin to which ferromagnetic powders are added.

The semiconductor device 10 of the modified example is as advantageous as the semiconductor device 10 of the example 3.

Example 4

In an example 4, the transformer assembly 18 is made of a material which is different from that of the semiconductor device 10 in the example 1.

Figure 10:
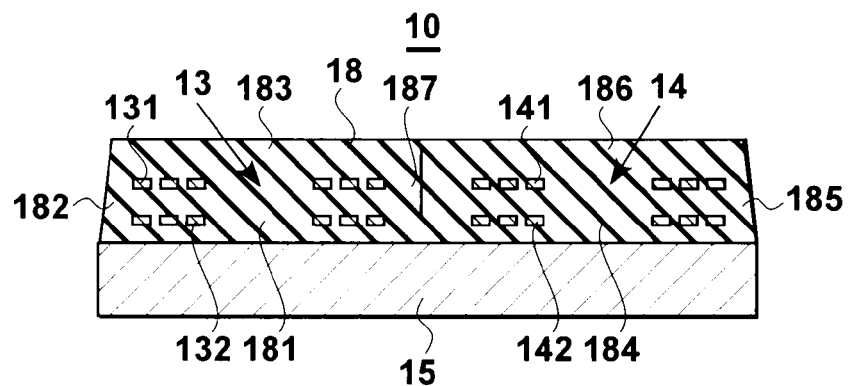
FIG. 10 is a schematic sectional view of an essential part of a semiconductor device of an example 4 of the invention.

As shown in FIG. 10, in the transformer assembly 18 of this example 4, the first core section 181, the first side shield section 182, the first upper shield section 183, the second side shield section 185, and the transformer shield section 187 are made of resin to which ferromagnetic powders are added. The ferromagnetic powders and resin are the same as those of the example 3.

The semiconductor device 10 of the example 4 is as advantageous as the semiconductor device 10 of the example 1. Further, the transformer assembly 18 made of the resin can be easily fabricated regardless of its complicated shape.

Further, the transformer assembly 18 of the example 4 may have a two-layer structure similarly to the transformer assembly 18 of the example 2 or the example 3.

Example 5

The layout of the first and second semiconductor chips 11 and 12, and the first and second transformers 13 and 14 is modified in an example 5.

Figure 11:
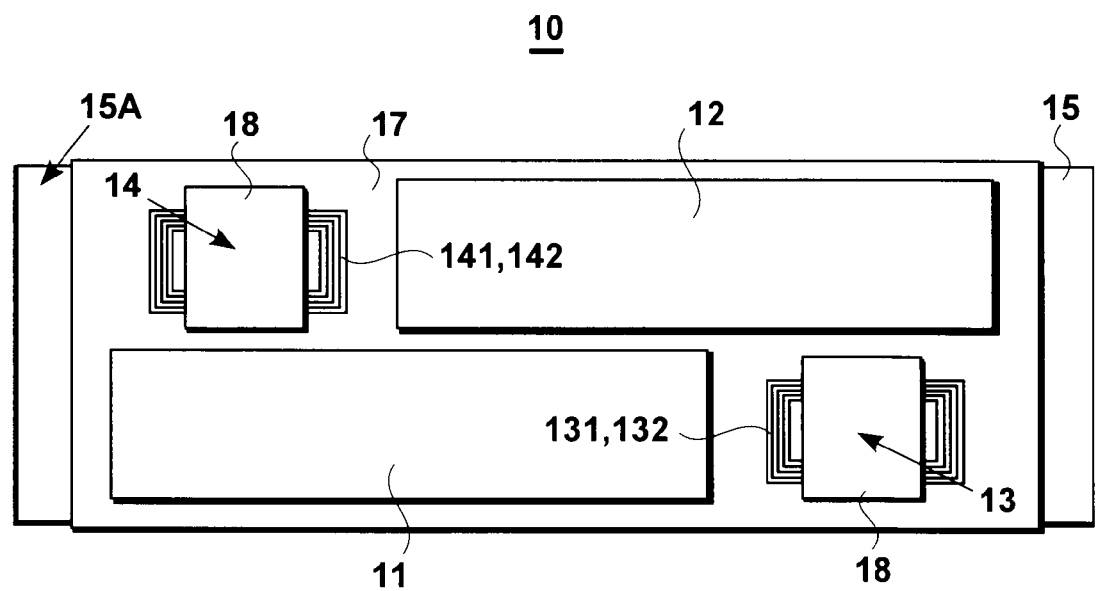
FIG. 11 shows the layout of semiconductor chips and transformers in an example 5 of the invention.

As shown in FIG. 11 related to the semiconductor device 10 of the example 4, the first semiconductor chip 11 is positioned along the lower left longer side of the surface 15A of the base substance 15 while the second semiconductor chip 12 is positioned along the upper right longer side of the surface 15A. The first and second semiconductor chips 11 and 12 are diametrically opposite each other on the surface 15A of the base substance 15. The first transformer 13 is positioned at the upper part of the surface 15A near the semiconductor chip 11 while the second transformer 14 is positioned at the lower part of the surface 15A near the second semiconductor chip 12. The transformers 13 and 14 are diametrically opposite each other.

In the example 1 to example 4, the first transformer 13 and the second transformer 14 are positioned between the first semiconductor chip 11 and the second semiconductor chip 12. In the example 5, the semiconductor device 10 adopts the layout in which the first and second semiconductor chips 11 and 12 are positioned between the first and second transformers 13 and 14. The first and second transformers 13 and 14 are appropriately separated in accordance with a space where the first and second semiconductor chips 11 and 12 are installed.

The semiconductor device 10 of the example 5 is as advantageous as the semiconductor device 10 of the example 1. Further, the first and second transformers 13 and 14 hold off from each other on the base substance 15, which is effective in suppressing influences of noises between them.

The semiconductor device 10 of the example 5 may be used in combination with the semiconductor devices 10 in the example 2 to example 4.

Other Example

While the invention has been described with reference to examples, modified examples and applications thereof, modifications and variations could be made thereto without departing from the scope of the invention set forth in the claims. The drawings are only for purpose of alternate examples and are not to be construed as limiting the invention. For instance, each of the semiconductor devices 10 mentioned above includes two transformers, i.e. the first and second transformers 13 and 14. The number of transformers is not always limited to that value. Further, the number of the semiconductor chips 11 and 12 is not always limited to two.

The invention has been described with respect to the electric connections between various power supply circuits of the highbred vehicle, but is not limited to the highbred vehicle. The invention is applicable to electrically connecting a plurality of circuits operating at different power levels. Further, the number of power levels is not limited. The invention is applicable to electric connections between circuits having three or more power levels.

Industrial Applicability

The invention is applicable to semiconductor devices which can accelerate transmission of electric signals and assure a long usable life.

Description of Reference Numerals

| | | | | | |
|---|---|---|---|---|---|
| 1 | in-vehicle electronic circuit system | | | 10 | semiconductor device |
| 100 | sealing body | | | | |
| 11 | first semiconductor chips | | | 11A, 11B, 12A & 12B | buffer |
| 11C | substrate regulator | | | | |
| 12 | second semiconductor chip | | | 13 | first transformer |
| 131 | first coil | 132 | second coil | 14 | second transformer |
| 141 | third coil | 142 | fourth coil | 15 | base substance |
| 16 | leads | 17 | multi-layer substrate | 171 | first insulator |
| 172 | first conductor | | | 173 | second insulator |
| 174 | second conductor | | | 175 | third insulator |
| 18 | transformer assembly | | | 18A | first transformer unit |
| 18B | second transformer unit | | | | |
| 181, 181A, 181B | first core sections | | | | |
| 182, 182A, 182B | first side shield section sections | | | | |
| 183, 183A, 183B | first upper shield section sections | | | | |
| 184, 184A, 184B | second core sections | | | | |
| 185, 185A, 185B | second side shield section sections | | | | |
| 186, 186A, 186B | second upper shield section sections | | | | |
| 187, 187A, 187B | transformer shield section sections | | | | |
| 188 | third side shield section | | | | |
| 189 | fourth side shield section | 191-194 | wires | | |
| 2 | low voltage circuit | 21 | low voltage battery | | |
| 22, 32 | DC-DC converters | 23 | microcomputer | | |
| 3 | high voltage circuit | 31 | high voltage battery | | |
| 33 | PAM converter | 34 | front end driver | | |
| 35 | driver | 36 | electric motor | | |

The invention claimed is:

1. A semiconductor device comprising:
a base substance including a ferromagnetic material;
a first semiconductor chip and a second semiconductor chip installed on the base substance;
a first coil installed on the ferromagnetic material of the base substance, and electrically connected to the first semiconductor chip;
a second coil placed on the first coil, electromagnetically connected to the first coil, and electrically connected to the second semiconductor chip;
a transformer assembly installed on the base substance, and made up by: a first core section extending from the center of the second coil to the center of the first coil; a first side shield section extending along a part of the side surface of the second coil and a part of a side surface of the first coil; and a first upper shield section placed on the first coil and the second coil, the first core section, the first side shield section and the first upper shield section being made of ferromagnetic materials;
a sealing body covering not only a part of the base substance but also the first semiconductor chip, the second semiconductor chip, the first coil, the second coil, and the transformer assembly; and
a third coil provided on the ferromagnetic material of the base substance at a position different from positions of the first coil and the second coil, and electrically connected to the first semiconductor chip; and a fourth coil provided on the third coil, electromagnetically connected to the third coil, and electrically connected to the second semiconductor chip, wherein the transformer assembly further includes: a second core section extending from the center of the fourth coil to the center of the third coil; a second side shield section provided along a part of a side surface of the fourth coil and a part of a side surface of the third coil; a first upper shield section provided on the third coil and the fourth coil; and a transformer shield section provided between the first coil and the second coil, and between the third coil and the fourth coil.

2. The semiconductor device defined in claim 1, further comprising a flexible multilayered substrate which is provided on a part of the surface of the base substance, and carrying thereon the first coil, the second coil, the third coil and the fourth coil.

3. The semiconductor device defined in claim 1, wherein the base substance and the transformer assembly are made of iron-nickel alloys.

4. The semiconductor device defined in claim 2, wherein the flexible multilayered substrate is provided on the part of the base substance, and includes a first insulator made of a flexible resin film, the second coil and the fourth coil provided on the first insulator; a second insulator provided on the second coil and the fourth coil and made of a flexible resin film, the first coil and the third coil provided on the second insulator, and a third insulator provided on the first coil and the third coil and made of a flexible resin film.

5. The semiconductor device defined in claim 2, wherein the first semiconductor chip and the second semiconductor chip stand off from each other on the multilayered substrate, and the first coil, the second coil, the third coil and the fourth coil are provided between the first semiconductor chip and the second semiconductor chip.

6. The semiconductor device defined in claim 1, wherein the first coil, the second coil and the first core section of the transformer assembly configure a first transformer, and the third coil, the fourth coil and the second core section of the transformer assembly configure a second transformer.

7. The semiconductor device defined in claim 6, wherein the first semiconductor chips functions as a driver, the second semiconductor chip functions as a buffer, and the first transformer and the second transformer receive signals from the driver and send them to the buffer.

* * * * *